United States Patent
Marinelli et al.

(10) Patent No.: US 7,977,943 B2
(45) Date of Patent: Jul. 12, 2011

(54) METHOD AND SYSTEM FOR RECONSTRUCTING IMAGES

(75) Inventors: Luca Marinelli, Schenectady, NY (US); Christopher Judson Hardy, Schenectady, NY (US); Daniel James Blezek, Rochester, MN (US)

(73) Assignee: General Electric Company, Niskayuna, NY (US)

( * ) Notice: Subject to any disclaimer, the term of this patent is extended or adjusted under 35 U.S.C. 154(b) by 273 days.

(21) Appl. No.: 12/421,266

(22) Filed: Apr. 9, 2009

(65) Prior Publication Data

US 2009/0256565 A1   Oct. 15, 2009

Related U.S. Application Data

(60) Provisional application No. 61/043,890, filed on Apr. 10, 2008.

(51) Int. Cl.
*G01V 3/00* (2006.01)
(52) U.S. Cl. ........................................ 324/309; 324/307
(58) Field of Classification Search .......... 324/300–322; 600/407–445
See application file for complete search history.

(56) References Cited

U.S. PATENT DOCUMENTS

| | | | | |
|---|---|---|---|---|
| 5,910,728 A * | 6/1999 | Sodickson | ..... | 324/309 |
| 7,301,340 B2 * | 11/2007 | Mens | ..... | 324/307 |
| 7,558,614 B2 * | 7/2009 | Griswold et al. | ..... | 600/410 |
| 7,590,589 B2 * | 9/2009 | Hoffberg | ..... | 705/37 |

* cited by examiner

*Primary Examiner* — Brij B Shrivastav
(74) *Attorney, Agent, or Firm* — Jason K. Klindtworth (57) ABSTRACT

A method for reconstructing an image in a magnetic resonance imaging system is provided. The method includes steps of acquiring magnetic resonance signals from a plurality of receiver coils placed about a subject, each receiver coil having a coil sensitivity, iteratively polling each acquired magnetic resonance signal for determining one or more significant wavelet components of each acquired magnetic resonance signal by utilizing a coil sensitivity function of each receiver coil for each acquired magnetic resonance signal, iteratively determining one or more coefficients based on the one or more significant wavelet components to generate a plurality of coefficients for each acquired magnetic resonance signal, reconstructing an image utilizing a corresponding plurality of coefficients corresponding to each acquired magnetic resonance signal, and generating a composite image by combining the reconstructed images.

13 Claims, 5 Drawing Sheets

METHOD AND SYSTEM FOR RECONSTRUCTING IMAGES

This non-provisional application claims the benefit of priority under 35 U.S.C. §119(e) to U.S. Provisional Patent Application Ser. No. 61/043890, filed Apr. 10, 2008, which is herein incorporated in its entirety by reference.

BACKGROUND

Embodiments of the invention relate generally to the field of magnetic resonance (MR) imaging, and more specifically to a method and system for reconstructing an MR image.

Magnetic resonance imaging (MRI) is a medical imaging technique most commonly used in radiology to visualize internal structures and functions of patients or objects. Typically, MRI uses a powerful magnetic field to magnetize protons of water in the body or any parts thereof. Consequent to the magnetization, the protons are aligned in the direction of the magnetic field. Another radio-frequency electromagnetic field is then briefly turned on that enables the protons to absorb some energy of the radio-frequency (RF) electromagnetic field. When the radio-frequency electromagnetic field is turned off, the protons release the energy at a radio-frequency which can be detected by a scanner. The position of protons in the body is then encoded by gradient coils. The gradient coils spatially encode the positions of protons by varying the magnetic field linearly across the body or any parts thereof. RF receive coils acquire the encoded information in the form of magnetic resonance (MR) signals that may be used to reconstruct an image.

Parallel imaging is one field of technology used in MRI for the reconstruction of images utilizing MR signals. In parallel imaging, the MR signals are received in parallel from a plurality of surface RF coils that are then processed for reconstruction of an image. Parallel acquisition of the MR signals substantially reduces acquisition time of MR signals. Unfortunately, parallel imaging leads to aliasing artifacts and increased noise in the reconstructed image.

Compressed sensing is another field of technology used in MRI for acquisition and reconstruction of images utilizing MR signals. Specifically, compressed sensing enables sampling of the MR signals at a rate lower than Nyquist rate, and still achieves substantially accurate reconstruction of the images. The speed of acquisition of the MR signals can be further increased by combining compressed sensing and parallel imaging.

Thus, it is highly desirable to develop a method and system that enables high-speed acquisition of images with reduced noise and aliasing artifacts in the MR signals leading to high-speed reconstruction of images. More particularly, there is a need for a distributed compressed sensing technique that substantially circumvents the shortcomings of compressed sensing and parallel imaging by combining compressed sensing and parallel imaging.

BRIEF DESCRIPTION

Briefly in accordance with one aspect of the invention a method for reconstructing an image in a magnetic resonance imaging system is provided. The method includes steps of acquiring magnetic resonance signals from a plurality of receiver coils placed about a subject, each receiver coil having a coil sensitivity, iteratively polling each acquired magnetic resonance signal for determining one or more significant wavelet components of each acquired magnetic resonance signal by utilizing a coil sensitivity function of each receiver coil for each acquired magnetic resonance signal, iteratively determining one or more coefficients based on the one or more significant wavelet components to generate a plurality of coefficients for each acquired magnetic resonance signal, reconstructing an image utilizing a corresponding plurality of coefficients corresponding to each acquired magnetic resonance signal; and generating a composite image by combining the reconstructed images.

In accordance with a further aspect of the present technique, a magnetic resonance imaging (MRI) system is provided. The MRI system includes a plurality of receiver coils placed about a subject configured to acquire magnetic resonance signals from the subject. The MRI system further includes a processing subsystem in operational communication with the plurality of receiver coils. The processing subsystem further includes an image reconstruction subsystem configured to acquire magnetic resonance signals from a plurality of receiver coils placed about a subject, each receiver coil having a coil sensitivity, iteratively poll each acquired magnetic resonance signal for determining one or more significant wavelet components of each acquired magnetic resonance signal by utilizing a coil sensitivity function of each receiver coil for each acquired magnetic resonance signal, iteratively determine one or more coefficients based on the one or more significant wavelet components to generate a plurality of coefficients for each acquired magnetic resonance signal, reconstruct an image utilizing a corresponding plurality of coefficients corresponding to each acquired magnetic resonance signal, and generate a composite image by combining the reconstructed images.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
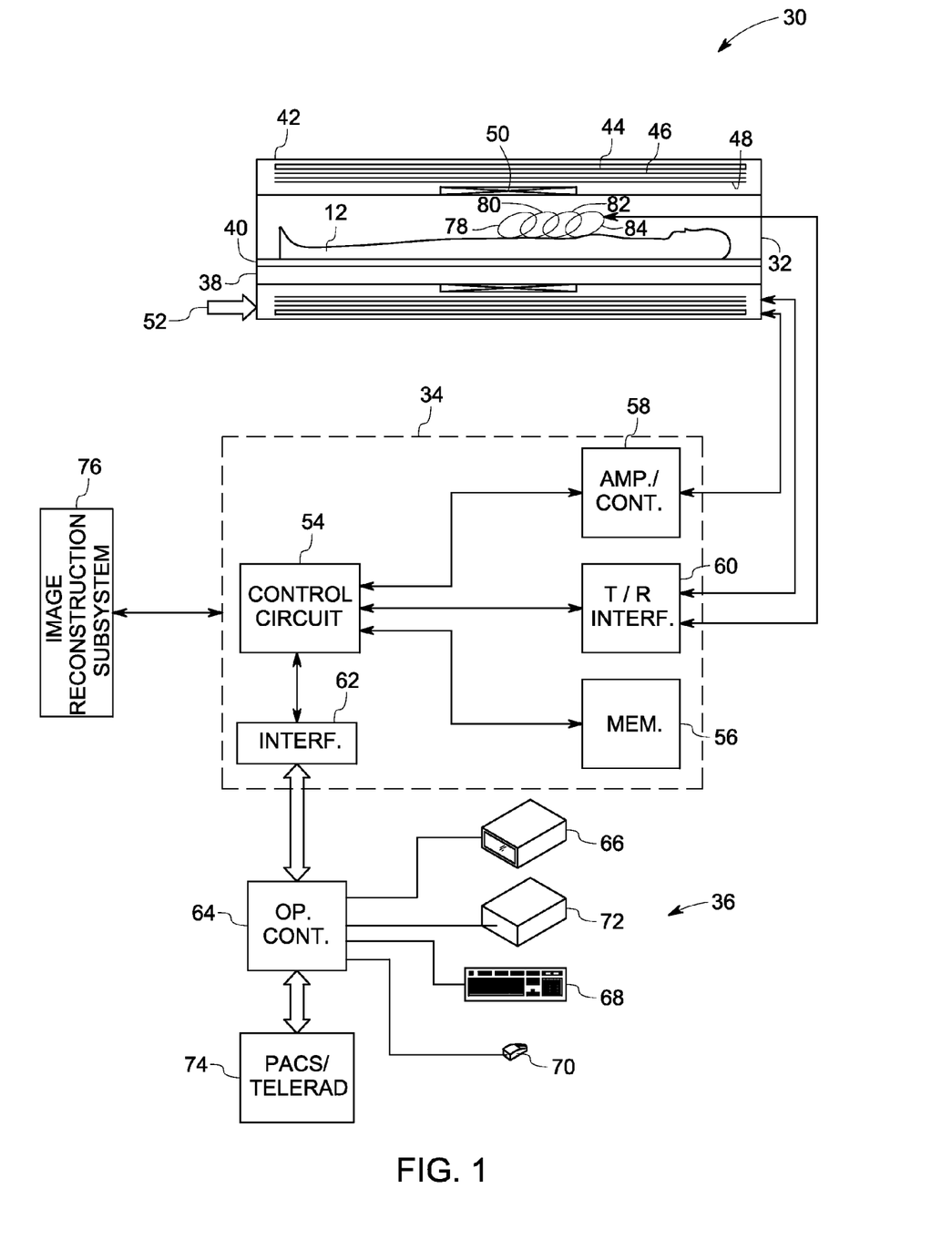
FIG. 1 is a diagrammatical view of an exemplary magnetic resonance imaging system, in accordance with exemplary aspects of the present technique.

FIG. 1 is a diagrammatical view of an exemplary magnetic resonance imaging (MRI) system, in accordance with exemplary aspects of the present technique. The MRI system 30 is illustrated diagrammatically as including a scanner 32, scanner control circuitry 34 and system control circuitry 36. While the MRI system 30 may include any suitable MRI scanner or detector, in the illustrated embodiment the MRI system 30 includes a full body scanner including a patient bore 38 into which a table 40 may be positioned to place a subject, such as a patient 12 in a desired position for scanning. The scanner 32 may be of any suitable type of rating, including scanners varying from 0.5 Tesla ratings to 1.5 Tesla ratings and beyond. Also, the subject need not be a patient such as a person or animal, but may include other objects, such as baggage, for example.

Additionally, the scanner 32 may include a series of associated coils for producing controlled magnetic fields, for generating radio-frequency (RF) excitation pulses, and for detecting emissions from gyromagnetic material within the patient 12 in response to such pulses. In the diagrammatical view of FIG. 1, a primary magnet coil 42 may be provided for generating a primary magnetic field generally aligned with the patient bore 38. A series of gradient coils 44, 46 and 48 may be grouped in a coil assembly for generating controlled magnetic gradient fields during examination sequences. A RF coil 50 may be provided for generating radio-frequency pulses for exciting the gyromagnetic material.

In a presently contemplated configuration, the gradient coils 44, 46 and 48 may have different physical configurations adapted to their function in the MRI system 30. The gradient coils 44, 46 and 48 include conductive wires, bars or plates that are wound or cut to form a coil structure that generates a gradient field upon application of control pulses as described below. The placement of the coils within the gradient coil assembly may be done in several different orders. In one embodiment, a Z-axis coil may be positioned at an innermost location, and may be formed generally as a solenoid-like structure that has relatively little impact on the RF magnetic field. Thus, in the illustrated embodiment, gradient coil 48 is the Z-axis solenoid coil, while coils 44 and 46 are Y-axis and X-axis coils, respectively.

The coils of the scanner 32 may be controlled by external circuitry to generate desired fields and pulses, and to read signals from the gyromagnetic material in a controlled manner. It may be noted that, when the material, typically bound in tissues of the patient 12, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, a RF frequency pulse is generated at or near the Larmor frequency of the material of interest, resulting in rotation of the net aligned moment to produce a net transverse magnetic moment. This transverse magnetic moment precesses around the main magnetic field direction, emitting RF signals that are detected by the scanner 32 and processed for reconstruction of the desired image.

Furthermore, the gradient coils 44, 46 and 48 may be configured to facilitate generation of precisely controlled magnetic fields, the strength of which vary over a predefined field of view, typically with positive and negative polarity. When each coil is energized with known electric current, the resulting magnetic field gradient is superimposed over the primary field and produces a desirably linear variation in the Z-axis component of the magnetic field strength across the field of view. The field varies linearly in one direction, but is homogenous in the other two. The three coils have mutually orthogonal axes for the direction of their variation, enabling a linear field gradient to be imposed in an arbitrary direction with an appropriate combination of the three gradient coils.

Moreover, the pulsed gradient fields perform various functions integral to the imaging process. Some of these functions are slice selection, frequency encoding and phase encoding. These functions may be applied along the X-axis, Y-axis and Z-axis of the original coordinate system or along other axes determined by combinations of pulsed currents applied to the individual field coils.

Also, the slice select gradient determines a slab of tissue or anatomy to be imaged in the patient 12. The slice select gradient field may be applied simultaneously with a frequency selective RF pulse to excite a known volume of spins within a desired slice that precess at the same frequency. The slice thickness is determined by the bandwidth of the RF pulse and the gradient strength across the field of view.

The frequency encoding gradient is also known as the readout gradient, and is usually applied in a direction perpendicular to the slice select gradient. In general, the frequency encoding gradient is applied before and during the formation of the MR echo signal resulting from the RF excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction may be accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction.

In addition, a great number of variations may be devised for pulse sequences employing the exemplary gradient pulse functions described hereinabove as well as other gradient pulse functions not explicitly described here. Moreover, adaptations in the pulse sequences may be made to appropriately orient both the selected slice and the frequency and phase encoding to excite the desired material and to acquire resulting MR signals for processing.

The coils of the scanner 32 are controlled by scanner control circuitry 34 to generate the desired magnetic field and RF pulses. In the diagrammatical view of FIG. 1, the control circuitry 34 is shown as including a control circuit 54 for commanding the pulse sequences employed during the examinations, and for processing received signals. The control circuit 54 may include any suitable programmable logic device, such as a CPU or digital signal processor of a general purpose or application-specific computer. Also, the scanner control circuitry 34 may further include memory circuitry 56, such as volatile and non-volatile memory devices for storing physical and logical axis configuration parameters, examination pulse sequence descriptions, acquired image data, programming routines, and so forth, used during the examination sequences implemented by the scanner.

Interface between the control circuit 54 and the coils of the scanner 32 is managed by amplification and control circuitry 58 and by transmission and receive interface circuitry 60. The amplification and control circuitry 58 includes amplifiers for each gradient field coil to supply drive current to the field coils in response to control signals from the control circuit 54. The transmit/receive (T/R) interface circuitry 60 includes additional amplification circuitry for driving the RF coil 50. Moreover, where the RF coil 50 serves both to emit the RF excitation pulses and to receive MR signals, the T/R circuitry 60 may typically include a switching device for toggling the RF coils 50 between active or transmitting mode, and passive or receiving mode. A power supply, denoted generally by reference numeral 52 in FIG. 1, is provided for energizing the primary magnet coil 42. Finally, the scanner control circuitry 34 may include interface components 62 for exchanging configuration and image data with the system control circuitry 36. It should be noted that, while in the present description reference is made to a horizontal cylindrical bore imaging system employing a superconducting primary field magnet assembly, the present technique may be applied to various other configurations, such as scanners employing vertical fields generated by superconducting magnets, permanent magnets, electromagnets or combinations of these means.

Furthermore, the gradient coils 44, 46 and 48 may be configured to facilitate generation of precisely controlled magnetic fields, the strength of which vary over a predefined field of view, typically with positive and negative polarity. When each coil is energized with known electric current, the resulting magnetic field gradient is superimposed over the primary field and produces a desirably linear variation in the Z-axis component of the magnetic field strength across the field of view. The field varies linearly in one direction, but is homogenous in the other two. The three gradient coils 44, 46 and 48 have mutually orthogonal axes for the direction of their variation, enabling a linear field gradient to be imposed in an arbitrary direction with an appropriate combination of the three gradient coils.

The system control circuitry 36 may include a wide range of devices for facilitating interface between an operator or radiologist and the scanner 32 via the scanner control circuitry 34. In the illustrated embodiment, for example, an operator controller 64 is provided in the form of a computer workstation employing a general purpose or application-specific computer. The workstation also typically includes memory circuitry for storing examination pulse sequence descriptions, examination protocols, user and patient data, image data, both raw and processed, and so forth. Further, the workstation may further include various interface and peripheral drivers for receiving and exchanging data with local and remote devices. In the illustrated embodiment, such devices include a conventional computer keyboard 68 and an alternative input device such as a mouse 70. A printer 72 may be provided for generating hard copy output of documents and images reconstructed from the acquired data. Moreover, a computer monitor 66 may be provided for facilitating operator interface. In addition, the system 30 may include various local and remote image access and examination control devices, represented generally by reference numeral 74 in FIG. 1. Such devices may include picture archiving and communication systems (PACS), teleradiology systems, and the like.

In certain embodiments, the MRI system 30 may include a plurality of receiver coils 78-84 for receiving MR signals of the patient 12. In the contemplated embodiment, the plurality of receiver coils 78-84 are in operational communication with the T/R interface circuitry 60. It may be noted that while the contemplated embodiment illustrates the plurality of receiver coils 78-84 as receivers of MR signals corresponding to the patient 12, the plurality of receiver coils 78-84 may be configured to receive MR signals corresponding to an object or any parts thereof. Further, various configurations of plurality of receiver coils 78-84 may be provided. For example, such plurality of receiver coils may include structures specifically adapted for target anatomies, such as head coil assemblies, and so forth. Moreover, the plurality of receiver coils 78-84 may be provided in any suitable physical configuration, including phased array coils, and so forth.

The MRI system 30 further includes an image reconstruction subsystem 76. In the contemplated configuration, the image reconstruction subsystem 76 is in operative association with the scanner control circuitry 34. In certain embodiments, the image reconstruction subsystem 76 may be a component of the scanner control circuitry 34. In one embodiment, the image reconstruction subsystem 76 may be configured to process the MR signals to determine significant wavelet components and a plurality of coefficients corresponding to each MR signal. As used herein, the term "significant wavelet component" may be representative of most important components of a MR signal in a wavelet basis having significant involvement in reconstruction of an image corresponding to the MR signal. Furthermore, the term "coefficient" is used herein in connection with the significant wavelet component. More particularly, each coefficient corresponds to a significant wavelet component. In still another embodiment, the image reconstruction subsystem 76 may be configured to reconstruct images utilizing the MR signals, where one image corresponds to one MR signal. In still another embodiment, the image reconstruction subsystem 76 may be configured to reconstruct images utilizing the plurality of coefficients corresponding to each MR signal, where each reconstructed image corresponds to a MR signal. Moreover, the image reconstruction subsystem 76 may further be configured to facilitate combination of the reconstructed images to reconstruct a composite image. The working of the image reconstruction subsystem 76 will be described in greater detail with reference to FIGS. 2-5. By generating the composite image as described hereinabove, an image having a substantially reduced number of errors may be obtained. More particularly, the composite image may be an image having substantially reduced aliasing artifacts and enhanced signal to noise ratio.

Figure 2:
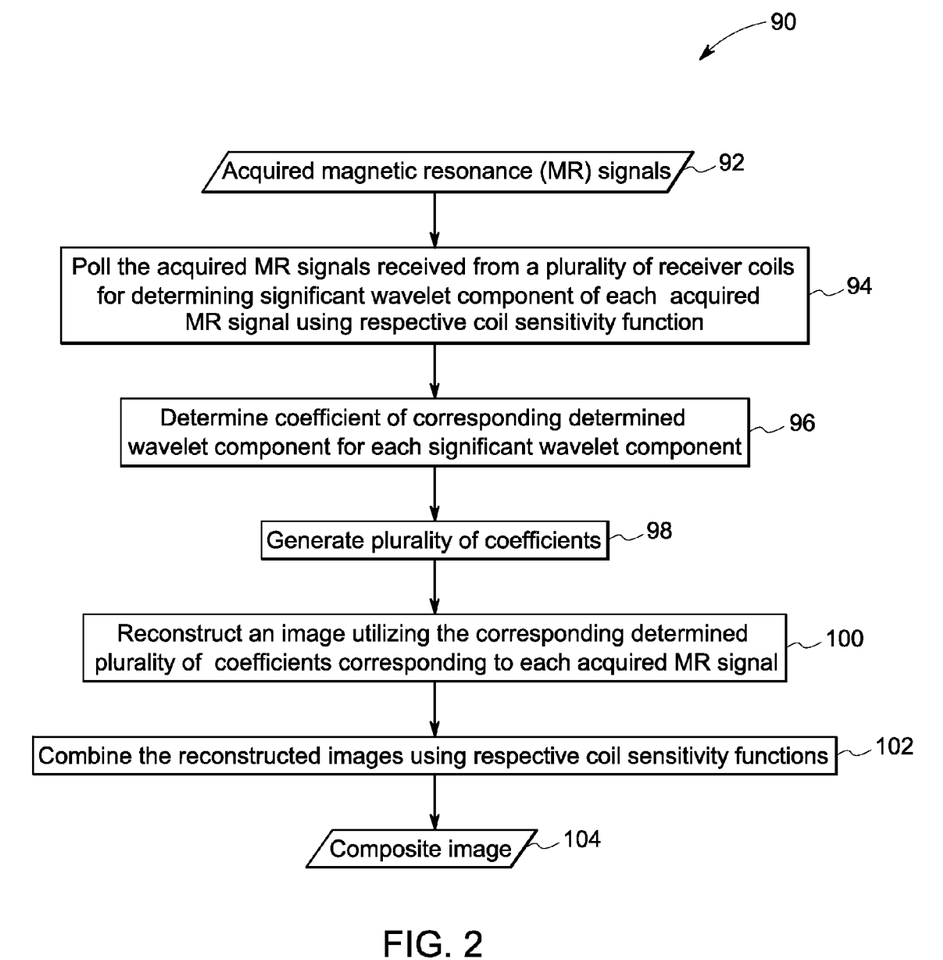
FIG. 2 is a flow chart illustrating an exemplary image reconstruction method, in accordance with aspects of the present technique.

FIG. 2 is a flow chart 90 illustrating an exemplary image reconstruction method, in accordance with aspects of the present technique. Reference numeral 92 may be representative of acquired magnetic resonance (MR) signals. As noted with reference to FIG. 1, the plurality of receiver coils 78-84 may be configured to acquire the MR signals 92. In one embodiment, each receiver coil 78-84 acquires a MR signal 92 of the object. By way of example, if a MRI system includes four receiver coils 78-84 represented by $RC_1$, $RC_2$, $RC_3$ and $RC_4$, then each receiver coil 78-84 acquires a corresponding MR signal 92 of the object resulting in four acquired MR signals 92 represented by $S_1$, $S_2$, $S_3$ and $S_4$.

In one embodiment, each acquired MR signal 92 may be iteratively polled for determining one or more significant wavelet components of each acquired MR signal 92 by utilizing a coil sensitivity function of each receiver coil 78-84 for each acquired magnetic resonance signal 92. In one embodiment, the coil sensitivity function of each receiver coil 78-84 is representative of the sensitivity of each receiver coil 78-84 for different regions of the patient 12 or an object. In one embodiment, a coil sensitivity function may be referred as a spatial function. In still another embodiment, the coil sensitivity function may be fixed for each receiver coil 78-84. Further to the iterative polling of each acquired MR signal 92, the image reconstruction subsystem 76 may iteratively determine one or more coefficients based on the one or more significant wavelet components to generate a plurality of coefficients for each acquired MR signal 92. The iterative polling of each acquired MR signal 92 and the iterative determination of the one or more coefficients will be described in greater detail with reference to steps 94-98 of FIG. 2.

In FIG. 2, the method starts at step 94, where the acquired MR signals 92 may be polled for determining a significant wavelet component corresponding to each acquired MR signal 92. More particularly, each acquired MR signal 92 may be polled using a coil sensitivity function of each receiver coil 78-84 for each acquired magnetic resonance signal 92. The determination of the significant wavelet component of each acquired MR signal 92 may be better understood with reference to FIG. 3.

Figure 3:
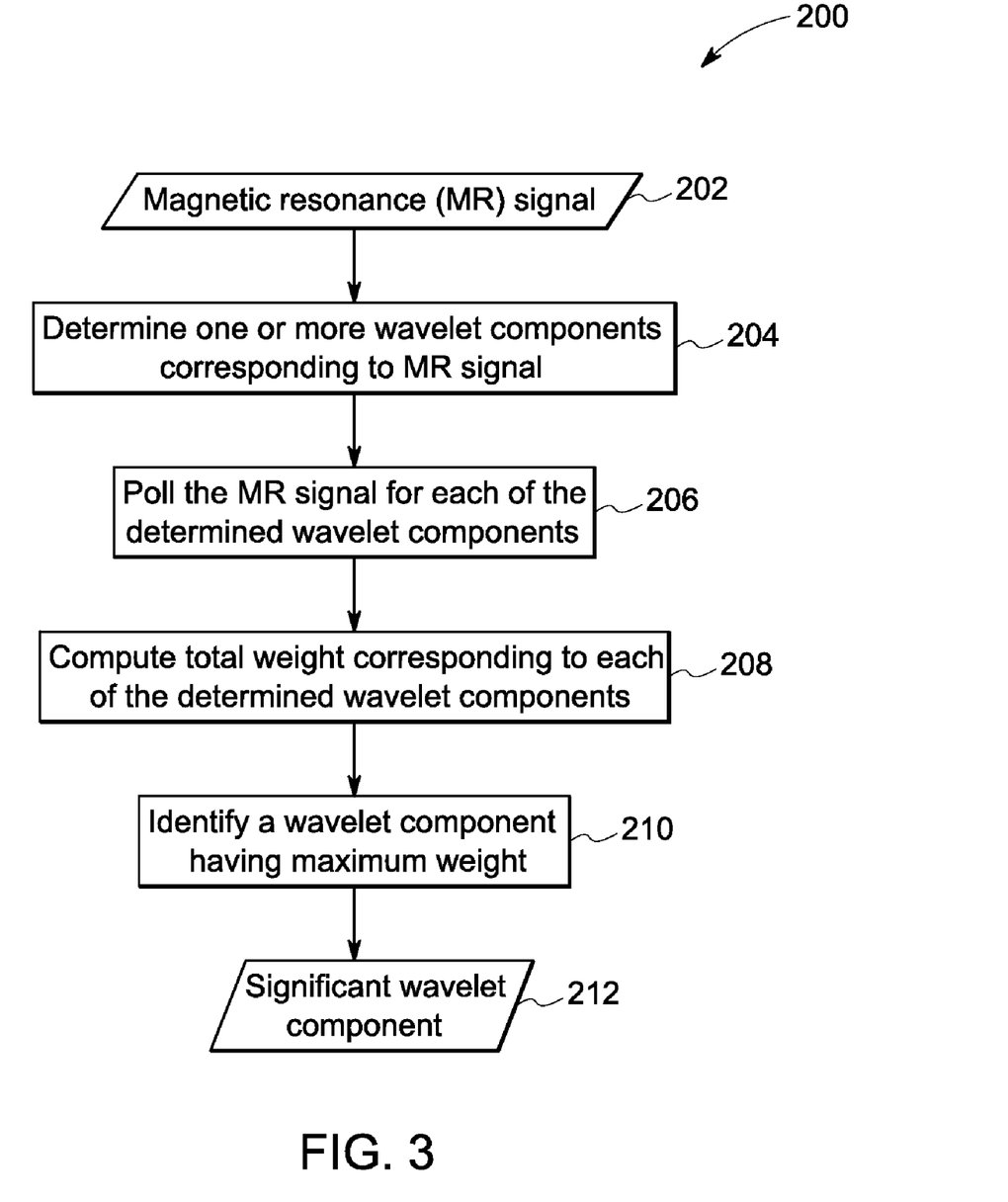
FIG. 3 is a flow chart illustrating an exemplary method for determining a significant wavelet component of a magnetic resonance (MR) signal, in accordance with aspects of the present technique.

Turning now to FIG. 3, a flow chart 200 illustrating an exemplary method for determining a significant wavelet component of a MR signal, in accordance with aspects of the present technique, is depicted. In one embodiment, FIG. 3 illustrates step 94 of FIG. 2 for determining the significant wavelet components of each acquired MR signal 92 (see FIG. 2) by polling each acquired MR signal 92.

Reference numeral 202 may be representative of a MR signal. In one embodiment, the MR signal 202 may be representative of the acquired MR signal 92. In certain embodiments, the MR signal 202 may be representative of an updated residual MR signal. As used herein, the term "updated residual MR signal" may be used to refer to a MR signal from which contributions of the determined one or more significant wavelet components have been removed. More particularly, the term "updated residual MR signal" may be used to refer to a MR signal from which contributions of data signals corresponding to the determined one or more coefficients from significant wavelet components of the MR signal have been removed.

The method starts at step 204, where one or more wavelet components corresponding to the MR signal 202 may be determined. In one embodiment, at step 204, the image reconstruction subsystem 76 may process the MR signal 202 to determine one or more wavelet components corresponding to the MR signal 202. In one embodiment, the image reconstruction subsystem 76 may determine the corresponding one or more wavelet components of the MR signal 202 such that a combination of the corresponding one or more wavelet components results in the complete MR signal 202.

Furthermore, at step 206, the MR signal 202 may be polled for each of the one or more determined wavelet components of the MR signal 202. As noted in FIG. 2, the MR signal 202 may be polled by utilizing coil sensitivity functions of the receiver coils 78-84. In certain embodiments, polling of the MR signal 202 may be conducted to determine an importance of each of the one or more determined wavelet components in view of the receiver coils 78-84. The importance of each of the one or more determined wavelet components may be judged by an amount of information contained by each of the one or more determined wavelet components. For instance, if there are two determined wavelet components $WC_1$ and $WC_2$ of a MR signal $S_1$, and the determined wavelet component $WC_1$ contains more information than information contained by determined wavelet component $WC_2$, then the determined wavelet component $WC_1$ is deemed more important than the determined wavelet component $WC_2$.

Subsequent to the polling for each of the one or more determined wavelet components at step 206, the total weight of each of the one or more determined wavelet components may be computed at step 208. The total weight of each of the one or more determined wavelet components may be determined using the polls for each of the one or more determined wavelet components. As used herein, "weight of the one or more determined wavelet component" may refer to the importance of the determined wavelet component in view of the plurality of receiver coils 78-84.

Further to the determination of the weight of each of the one or more determined wavelet components, a determined wavelet component having a maximum weight may be identified as indicated by step 210. The determined wavelet component having the maximum weight may be identified as a significant wavelet component 212. As used herein, the term "significant wavelet component" may be representative of a determined wavelet component having maximum information in comparison to the rest of the determined wavelet components of the MR signal 202. In one embodiment, the significant wavelet component may be determined by solving an optimization problem in equation (1) below:

$$n_l = \arg\max_{n=1\ldots N} \sum_{j=1}^{J} |P_j^t(r_{j,l-1})| \qquad (1)$$

where J is the number of receiver coils, N is the dimensionality of the wavelet decomposition of the acquired MR signals, r is acquired magnetic resonance signal 202 or the updated residual magnetic resonance signal, and l refers to an iteration step. Further, $P_j^t(r_{j,l-1})$ may be determined as indicated in equation (2) below:

$$P_j^t m_j = \Psi(1/C_j F^{-1} m_j) \qquad (2)$$

where $m_j$ may be equated to $r_j$, $F^1$ is the inverse Fourier transform, Cj is the coil sensitivity function for the $j^{th}$ receiver coil (j=1, . . . , J), $m_j$ are k-space measurements for each receiver coil, and $\Psi$ is the sparsifying transform (for example wavelet transform).

In still another embodiment, the $m_j$ may be determined by solving equation (3) below:

$$P_j y = F(C_j \Psi^{-1} y) \qquad (3)$$

where $P_j y$ is equal to $m_j$, F is the Fourier transform, Cj is the coil sensitivity function for the $j^{th}$ receiver coil (j=1, . . . , J), and $\Psi^{-1}$ is inverse sparsifying transform.

With returning reference to FIG. 2, at step 96, a coefficient for each significant wavelet component corresponding to each acquired MR signal 92 may be determined. Accordingly, a first coefficient corresponding to each acquired MR signal 92 may be determined utilizing a corresponding determined significant wavelet component. In certain embodiments, the coefficient may be determined utilizing an orthogonal matching pursuit algorithm, a simultaneous orthogonal matching pursuit algorithm, or a matching pursuit algorithm. The determination of the coefficient, in accordance with an exemplary aspect may be better understood with reference to FIG. 4.

Figure 4:
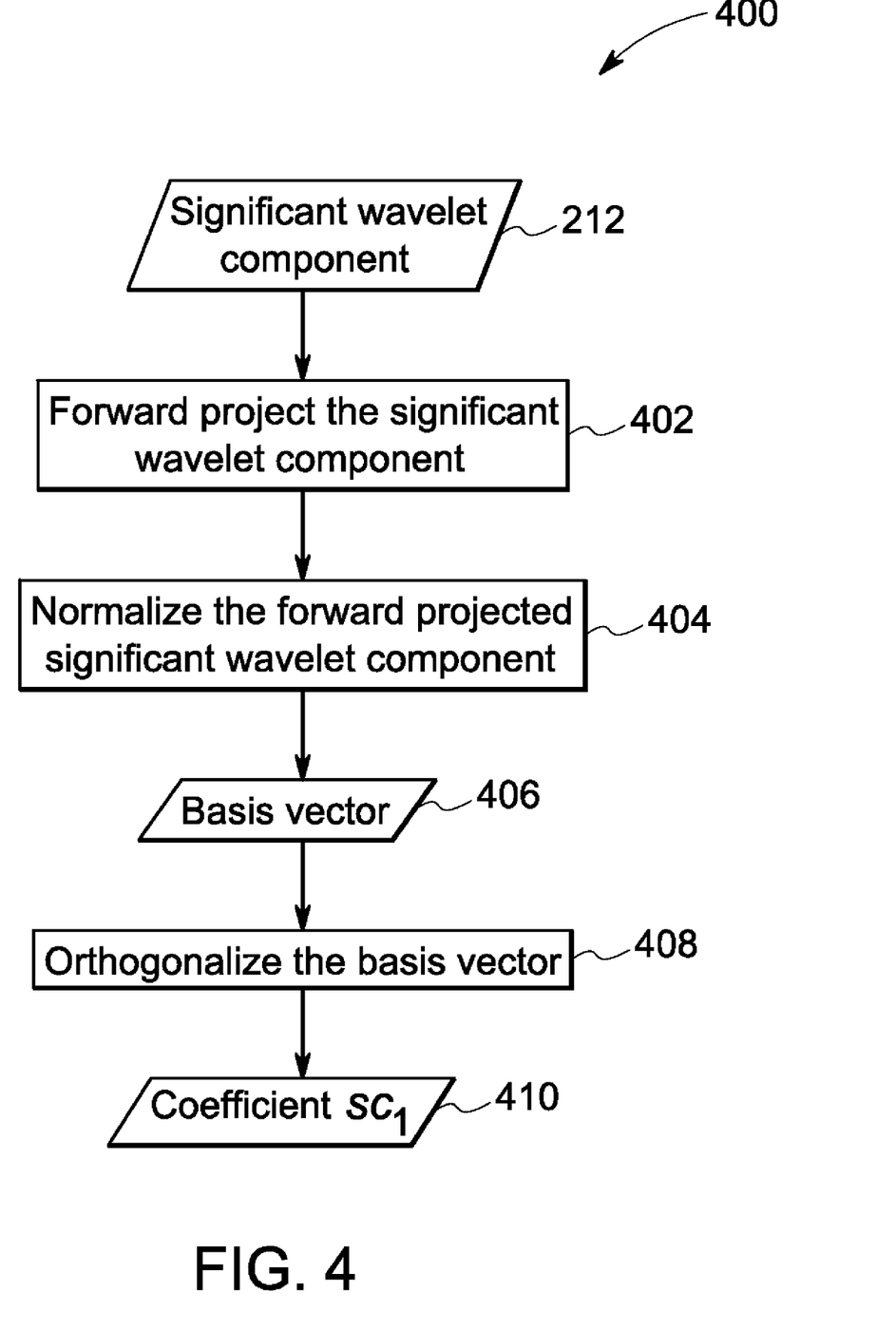
FIG. 4 is a flow chart illustrating an exemplary method for determining a coefficient corresponding to a significant wavelet component, in accordance with aspects of the present technique.

Turning now to FIG. 4, a flow chart 400 illustrating an exemplary method for determining a coefficient corresponding to a significant wavelet component, in accordance with aspects of the present technique is depicted. More particularly, a method of determining at least one coefficient corresponding to each significant wavelet component associated with each acquired MR signal 92 (see FIG. 2) is illustrated in greater detail in FIG. 4.

The method starts at step 402, where the significant wavelet component 212 (see FIG. 3) corresponding to the MR signal 202 (see FIG. 3) may be forward projected. Subsequently, the forward projected significant wavelet component may be normalized at step 404. The normalization of the forward projected significant wavelet component results in a basis vector 406. In certain embodiments, basis vectors may be determined for each of the significant wavelet components determined at step 94 of FIG. 2 utilizing the steps 402 and 404 on each of the significant wavelet components.

Further, at step 408, the basis vector 406 may be orthogonalized resulting in a coefficient $sc_1$ 410. In one embodiment, the coefficient $sc_1$ 410 is the first coefficient corresponding to the acquired MR signal 92. In certain embodiments, the basis vector 406 is orthogonalized with respect to the corresponding determined one or more basis vectors. In one embodiment, the basis vector may be orthogonalized to reduce a redundancy between the basis vector 406 and the corresponding determined basis vectors.

With returning reference to FIG. 2, at step 98, a plurality of coefficients corresponding to each acquired MR signal 92 (see FIG. 2) may be generated. In one embodiment, the plurality of coefficients may include the determined one or more coefficients. The generation of a plurality of coefficients may be better understood with reference to FIG. 5.

Figure 5:
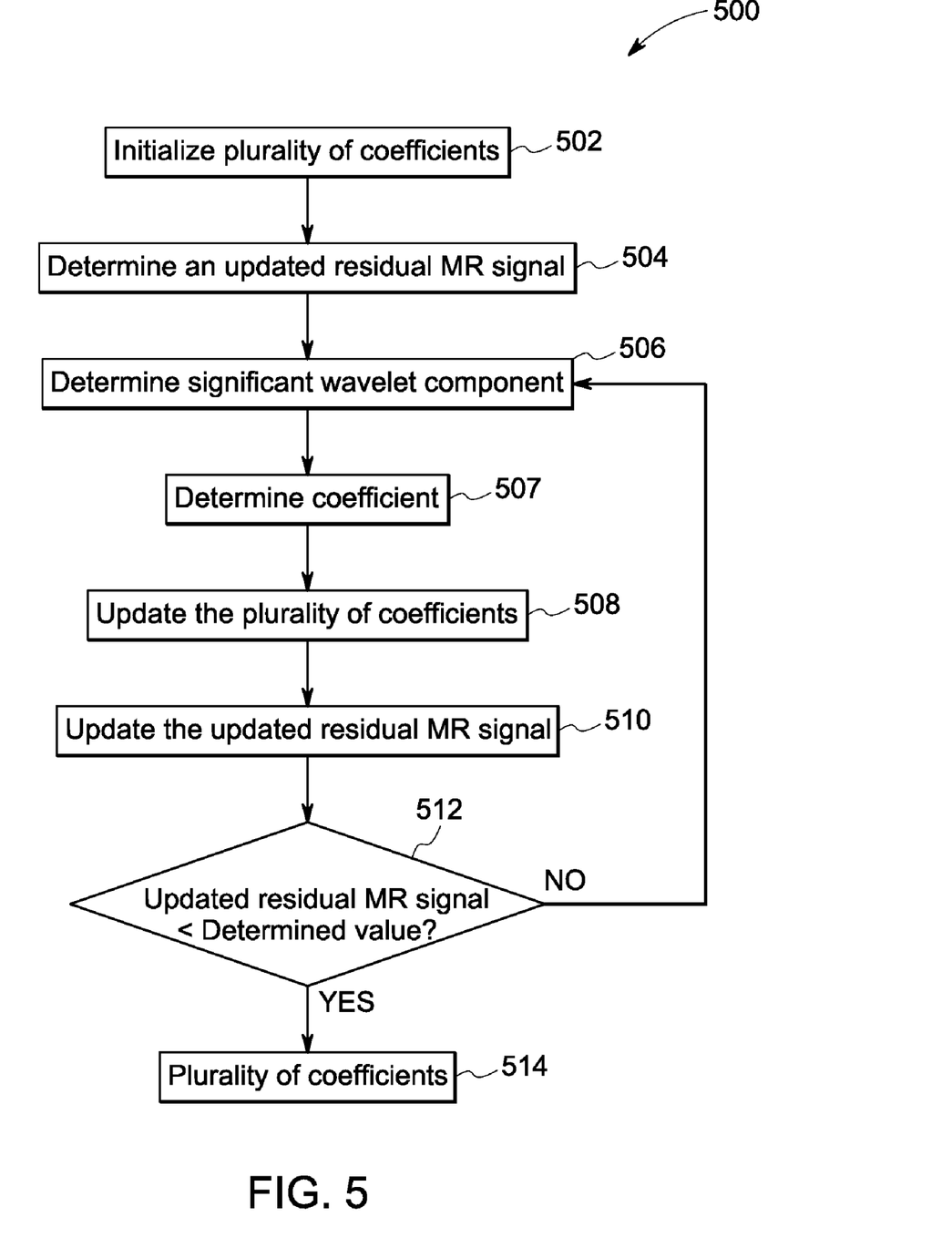
FIG. 5 is a flow chart illustrating an exemplary method for generating a plurality of coefficients, in accordance with aspects of the present technique.

FIG. 5 is a flow chart 500 illustrating an exemplary method for generating a plurality of coefficients, in accordance with aspects of the present technique. More particularly, the processing of step 98 of FIG. 2 is presented in further detail in FIG. 5. The method starts at step 502, where the plurality of coefficients is initialized. In one embodiment, the plurality of coefficients may be initialized to include at least the first coefficient $sc_1$ 410 (see FIG. 4).

Subsequently, at step 504, an updated residual MR signal corresponding to the acquired MR signal 92 (see FIG. 2) may be determined. In one embodiment, the updated residual MR signal corresponding to the acquired MR signal 92 may be determined by subtracting data signals corresponding to at least the first coefficient from the acquired MR signal 92. This updated residual MR signal is subsequently used to determine its corresponding significant wavelet component as indicated by step 506. Furthermore, at step 507, a coefficient may be determined corresponding to the significant wavelet component determined at step 506. In certain embodiments, the significant wavelet component and the coefficient are determined utilizing an orthogonal matching pursuit algorithm, a simultaneous orthogonal matching pursuit algorithm or a matching pursuit algorithm. In one embodiment, the updated residual MR signal may be processed via steps 202-212 (see FIG. 3) to determine a significant wavelet component and 402-410 (see FIG. 4) to determine the corresponding coefficient.

Further, at step 508, the plurality of coefficients may be updated by including the determined coefficient in the plurality of coefficients. The determined coefficient may then be used to further update the previously updated residual MR signal as depicted by step 510. In one embodiment, the updated residual MR signal may be further updated by subtracting data signal corresponding to the determined coefficient from the updated residual MR signal.

In accordance with aspects of the present technique, the updated residual MR signal may be updated until the newly updated residual MR signal has a value less than a determined value. Accordingly, at step 512, a check is carried out to verify if the newly updated residual MR signal is less than a determined value. At step 512, if the newly updated residual MR signal is greater than a determined value, the control may be transferred to step 506. However, if the newly updated residual MR signal is less than the determined value, further updating of the plurality of coefficients is stopped resulting in a complete set of coefficients 514.

With returning reference to FIG. 2, at step 100, the plurality of coefficients 514 (see FIG. 5) corresponding to each acquired MR signal generated at step 98 may be used to reconstruct images corresponding to each acquired MR signal 92. For instance, if there are five acquired MR signals, then five images are reconstructed utilizing their corresponding plurality of coefficients 514.

Furthermore, at step 102, the reconstructed images are combined to form a composite image 104. In one embodiment, the reconstructed images generated at step 100 may be combined using a sum-of-squares combination method. In still another embodiment, the reconstructed images generated at step 100 may be combined using an optimal phased array combination method. In still another embodiment, the receonstructed images are combined utilizing respective receiver coil sensitivity function.

By applying the described technique hereinabove, an image may be reconstructed having reduced aliasing artifacts and noise. It further enables enhanced speed of reconstruction of images with reduced noise and aliasing artifacts in the MR signals. More particularly, the technique provides a distributed compressed sensing technique that advantageously circumvents the shortcomings of compressed sensing and parallel imaging.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for reconstructing an image in a magnetic resonance imaging system, comprising:
    acquiring magnetic resonance signals from a plurality of receiver coils placed about a subject, each receiver coil having a coil sensitivity;
    iteratively polling each acquired magnetic resonance signal for determining one or more significant wavelet components of each acquired magnetic resonance signal by utilizing a coil sensitivity function of each receiver coil for each acquired magnetic resonance signal;
    iteratively determining one or more coefficients based on the one or more significant wavelet components to generate a plurality of coefficients for each acquired magnetic resonance signal;
    reconstructing an image utilizing a corresponding plurality of coefficients corresponding to each acquired magnetic resonance signal; and
    generating a composite image by combining the reconstructed images.

2. The method of claim 1, wherein iteratively polling each acquired magnetic resonance signal for determining one or more significant wavelet components of each acquired magnetic resonance signal comprises:
    determining one or more wavelet components corresponding to each acquired magnetic resonance signal;
    polling each acquired MR signal for each of the one or more determined wavelet components to assign a weight to each of the one or more determined wavelet components;
    computing a total weight corresponding to each of the one or more determined wavelet components; and
    identifying a wavelet component having a maximum weight.

3. The method of claim 1, wherein iteratively determining the one or more coefficients based on the one or more significant wavelet components to generate a plurality of coefficients, comprises:
    determining a coefficient corresponding to each acquired magnetic resonance signal;
    updating each acquired magnetic resonance signal utilizing the corresponding coefficient to generate an updated residual magnetic resonance signal corresponding to each acquired magnetic resonance signal; and
    iteratively determining a coefficient corresponding to each updated residual magnetic resonance signal until each updated residual magnetic resonance signal is less than a determined value.

4. The method of claim 3, wherein updating each acquired magnetic resonance signal utilizing the corresponding coefficient comprises removing contributions of each significant wavelet component corresponding to the coefficient from each corresponding acquired magnetic resonance signal.

5. The method of claim 3, wherein iteratively determining the coefficient corresponding to each updated residual magnetic resonance signal further comprises updating each updated residual magnetic resonance signal.

6. The method of claim 5, wherein updating each updated residual magnetic resonance signal comprises removing contributions of each significant wavelet component corresponding to the determined coefficient from each corresponding updated residual magnetic resonance signal.

7. The method of claim 5, further comprising generating a plurality of coefficients utilizing the determined coefficients for each acquired magnetic resonance signal.

8. The method of claim 3, wherein determining the coefficient corresponding to each acquired magnetic resonance signal comprises determining one or more coefficients utilizing an orthogonal matching pursuit algorithm, a simultaneous orthogonal matching pursuit algorithm, or a matching pursuit algorithm.

9. The method of claim 3, wherein determining the coefficient corresponding to each acquired magnetic resonance signal comprises:
forward projecting each significant wavelet component corresponding to each acquired magnetic resonance signal;
determining a basis vector corresponding to each significant wavelet component by normalizing each forward projected significant wavelet component; and
orthogonalizing each basis vector to determine a coefficient corresponding to each significant wavelet component.

10. A magnetic resonance imaging system, comprising:
a plurality of receiver coils placed about a subject configured to acquire magnetic resonance signals from the subject;
a processing subsystem in operational communication with the plurality of receiver coils, and comprising an image reconstruction subsystem configured to:
acquire magnetic resonance signals from a plurality of receiver coils placed about a subject, each receiver coil having a coil sensitivity;
iteratively poll each acquired magnetic resonance signal for determining one or more significant wavelet components of each acquired magnetic resonance signal by utilizing a coil sensitivity function of each receiver coil for each acquired magnetic resonance signal;
iteratively determine one or more coefficients based on the one or more significant wavelet components to generate a plurality of coefficients for each acquired magnetic resonance signal;
reconstruct an image utilizing a corresponding plurality of coefficients corresponding to each acquired magnetic resonance signal; and
generate a composite image by combining the reconstructed images.

11. The system of claim 10, further comprising a display device for displaying transitional images, reconstructed images, or a combination thereof.

12. The system of claim 10, wherein the plurality of receiver coils comprises one or more receiving components for acquiring the magnetic resonance signals.

13. The system of claim 10, wherein the plurality of receiver coils is controlled by a control circuitry.

* * * * *

UNITED STATES PATENT AND TRADEMARK OFFICE
CERTIFICATE OF CORRECTION

PATENT NO. : 7,977,943 B2
APPLICATION NO. : 12/421266
DATED : July 12, 2011
INVENTOR(S) : Marinelli et al.

Page 1 of 1

It is certified that error appears in the above-identified patent and that said Letters Patent is hereby corrected as shown below:

In Column 8, Line 21, delete "F1" and insert -- F-1 --, therefor.

In Column 10, Line 3, delete "receonstruction" and insert -- reconstruction --, therefor.

Signed and Sealed this
Twenty-fifth Day of September, 2012

David J. Kappos
*Director of the United States Patent and Trademark Office*